United States Patent [19]

Tanaka

[11] Patent Number: 4,924,800
[45] Date of Patent: May 15, 1990

[54] APPARATUS FOR APPLYING PHOTO-RESIST TO SUBSTRATE

[75] Inventor: Masato Tanaka, Nagahama, Japan

[73] Assignee: Dainippon Screen Mfg. Co. Ltd., Japan

[21] Appl. No.: 296,389

[22] Filed: Jan. 9, 1989

Related U.S. Application Data

[62] Division of Ser. No. 936,126, Dec. 1, 1986, abandoned.

[30] Foreign Application Priority Data

Dec. 2, 1985 [JP] Japan ..................... 60-269322

[51] Int. Cl.⁵ ............... B05C 11/02; B05C 11/14; B05C 5/02; B05C 9/06
[52] U.S. Cl. .................. 118/50.1; 118/634; 118/642; 118/58
[58] Field of Search ............... 118/620, 630, 634, 641, 118/642, 58, 50.1

[56] References Cited

U.S. PATENT DOCUMENTS

| | | | |
|---|---|---|---|
| 3,549,368 | 12/1970 | Collins et al. | 430/317 |
| 3,705,055 | 12/1972 | Christensen et al. | 427/39 |
| 4,197,344 | 4/1980 | Tshudy | 118/58 |
| 4,238,559 | 12/1980 | Feng et al. | 430/156 |
| 4,520,750 | 6/1985 | Mansour | 118/58 |
| 4,564,584 | 1/1986 | Fredericks et al. | 430/312 |
| 4,592,926 | 6/1986 | Rubin et al. | 427/255 |
| 4,608,943 | 9/1986 | Doehler et al. | 118/50.1 |
| 4,686,173 | 8/1987 | Kanamori et al. | 430/313 |

*Primary Examiner*—Willard Hoag
*Attorney, Agent, or Firm*—Davis, Bujold & Streck

[57] ABSTRACT

Disclosed are improved method and apparatus by which the adhesion of a photo-resist applied onto a wafer substrate can be improved when using an adhesion reinforcing agent in combination. The method of applying a photo-resist according to the present invention comprises a steps of washing the substrate, a step of drying said substrate, a step of feeding an adhesion reinforcing agent to said substrate while heating it to a prescribed temperature, a step of carrying out additional heating in the state that the adhesion reinforcing agent is stopped from being fed to said substrate, a stop of cooling said substrate to a room temperature, and a step of coating the surface of said substrate with the photo-resist.

6 Claims, 6 Drawing Sheets

APPARATUS FOR APPLYING PHOTO-RESIST TO SUBSTRATE

This is a divisional of co-pending application Ser. No. 936,126, filed on Dec. 1, 1986, now abandoned.

BACKGROUND OF THE INVENTION

The present invention relates to improvements in a method of, and an apparatus for, applying a photo-resist to a sheet substrate such as a wafer substrate and a glass plate. Particularly, it relates to improvements in a method and an apparatus that can enhance the adhesion of a photo-resist to the sheet substrate by using an adhesion reinforcing agent.

For example, when producing electronic parts such as electrode substrates for LCD (liquid crystal displays) and thermal heads for facsimile equipment, it has been generally practiced to apply a photo-resist to the surface of a variety of substrates including a wafer substrate having an oxide coating comprising silicone dioxide or the like, a wafer substrate comprising amorphous silicon, polysilicon or the like, and a substrate such as a glass plate and a ceramic plate, etc., followed by printing desired resist patterns on the photo-resist thus applied, and further followed by development of the photo-resist to form desired resist patterns on the substrate.

During the course of forming such resist patterns, imperfectly dried substrate may result in poor adhesion of the photo-resist to the substrate to bring about problems such that, as shown in FIG. 8, the peripheral portions of a resist pattern 3 formed on an oxide coating 2 covering the surface of a wafer substrate 1 rises from the surface of the oxide coating 2, and, when the oxide coating 2 on the substrate is etched, the side etching occurs as shown in FIG. 9. Such side etching undercuts the patterns on the oxide coating 2 and tends to cause breakage at the undermined portions and this is a serious problem.

In order to prevent such side etching, the substrate must be perfectly dry substrate, and the adhesion of a photo-resist to the surface of a substrate must be enhanced.

To cope with such requirements, there have been made various proposals. For example, U.S. Pat. No. 3,549,368 discloses a method by which the adhesion between an oxide coating on a substrate and a photo-resist can be improved by use of an adhesion reinforcing agent comprising hexamethyldisilazane (hereinafter merely referred to as "HMDS"). Japanese Unexamined Patent Publication No. 86829/1985 also discloses a method in which a substrate is heated at the same time when an adhesion reinforcing agent is fed to a substrate. Japanese Unexamined Patent Publication No. 109324/1985 further discloses an apparatus in which the drying of a substrate, the coating of an adhesion reinforcing agent and also the cooling of the substrate are carried out in a single chamber.

In this prior art, however, when the adhesion reinforcing agent such as HMDS is fed to a substrate, it is fed to the substrate in an excessive amount, and the adhesion of a photo-resist to the substrate can be damaged rather than enhanced. Still being unsolved the above-mentioned serious problems can result in breakage at portions having narrow width of the patterns.

Now, to carry out the application of a photo-resist to a substrate, a so-called spin-coating device or roll-coating device is generally used. When a photo-resist is applied to a substrate by use of the former device, which is designed so that the photo-resist fed on the surface of a substrate can be spread out thinly by the action of centrifugal force, a resist coating can be relatively uniformly formed throughout the entire surface of the substrate. However, a problem involved in this spin-coating is that the substrates that can be treated are limited to those having a round shape as in a wafer substrate. It can be also pointed out that the adhesion of a photo-resist to a substrate can be damaged when an excessive amount of the photo-resist remains unremoved on the surface of a substrate. When, on the other hand, a photo-resist is applied to a substrate by use of the latter device (i.e., the roll-coating device), there is a problem that is difficult to form a coating of the photo-resist fed to the surface of a substrate in a uniform fashion throughout the entire surface thereof, although there is no limitation on the shape of the substrate to be treated as in the case of the spin-coating. In particular, when the coating of a photo-resist is carried out by use of the roll-coating device, a roll is provided with a number of narrow circumferential grooves cut on the periphery of the roll, for the purpose of retaining an adequate amount of the photo-resist on the periphery of the roll. Due to these narrow grooves, irregularities may occur on the photo-resist applied to a substrate, thereby making it difficult to obtain a uniform resist coating.

SUMMARY OF THE INVENTION

The present invention has been made taking into consideration the above circumstances, and a first object of the invention is to make it possible to obtain precision resist patterns by improving the adhesion of a photo-resist to a substrate. A second object of the invention is to achieve the uniformness in the coating thickness of the photo-resist applied on a substrate. A third object of the invention is to make the method applicable both in the spin coating and the roll-coating. Other object will be made apparent from the descriptions on the preferred embodiments and the drawing set forth hereinafter.

The above objects can be achieved by the present invention, which is concerned with a method of applying a photo-resist to the surface of a substrate to be treated, comprising (i) a step of washing said substrate, (ii) a step of drying said substrate, (iii) a step of feeding an adhesion reinforcing agent to said substrate while heating it to a prescribed temperature, (iv) a step of carrying out additional heating in the state that the adhesion reforcing agent is evaporated from to said substrate, (v) a step of cooling said substrate to a room temperature, and (vi) a step of coating the surface of said substrate with the photo-resist. In the present invention, it is preferable to carry out ultraviolet irradiation or ozone feeding, or both of these, to the substrate to decompose and remove organic substances remaining on the surface of the substrate. The heating of the substrate in the step (iv) is carried out at a temperature ranging between 100° C. and 200° C., preferable between 100° C. and 120° C. It is also preferable to preheating the substrate to substantially the same temperature as the heating temperature in the step (iv). In the present invention, the coating of the photo-resist in the step (vi) is applicable to both the coating by a roll-coating device and the coating by a spin-coating device.

According to another feature of the present invention, it is also concerned with an apparatus for applying a photo-resist to the surface of a substrate to be treated, comprising (i) a conveyor means for conveying said substrate, (ii) an adhesion reinforcing agent feeding means for feeding an adhesion reinforcing agent to said substrate, (iii) an additional heating means provided at a stage posterior to said adhesion reinforcing agent feeding means, (iv) a cooling means for cooling the substrate to a room temperature, provided at a state posterior to said additional heating means, and further (v) a photo-resist feeding means for feeding the photo-resist to the surface of the substrate, provided at a stage posterior to said cooling means; wherein said adhesion reinforcing agent feeding means comprises a treatment chamber enclosing the peripheral area of the substrate, a feeding pipe for feeding the adhesion reinforcing agent to said treatment chamber, a distributor having a plurality of minute holes, provided opposite to the substrate in said treatment chamber, an auxiliary chamber provided on the periphery of said treatment chamber, an exhaust tube connected to said auxiliary chamber, and a heating means for heating said substrate; and said additional heating means comprises a chamber enclosing the peripheral area of the substrate, an exhaust tube connected to said chamber, and an additional heating means for additionally heating the substrate. In this apparatus, it is preferable to provide an ultraviolet irradiation means or an ozone feeding means, or both of these, at a stage anterior to the adhesion reinforcing agent feeding means. In the apparatus according to the present invention, it is possible to constitute integrally said adhesion reinforcing agent feeding means and said additional heating means. The above-mentioned photo-resist feeding means is applicable in both the coating by a roll-coating device and the coating by a spin-coating device. The above-mentioned roll-coating device comprises a pair of rolls and a nozzle for feeding a photo-resist to the internface of said pair of rolls, and is constituted in such a manner that a photo-resist coating is formed on the surface of the substrate by rotating the pair of rolls along with the ocnveyance of the substrate. The spin-coating device comprises a holder for holding the substrate, an upward and downward movable rotating shaft, which turns said holder at a predetermined speed, a conveyor means for conveying the substrate onto said holder, and a nozzle for feeding the photo-resist to the substrate held on said holder.

DESCRIPTION OF THE PREFERRED EMBODIMENTS

Figure 1:
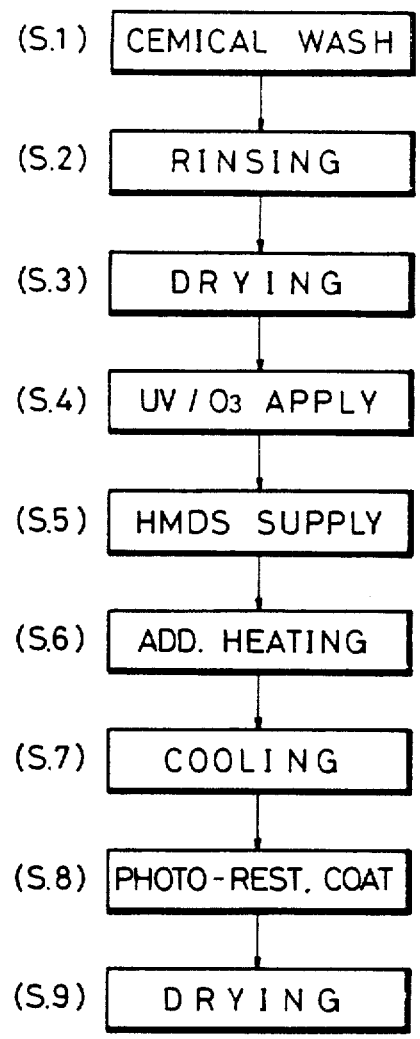
FIG. 1 is a flow chart schematically showing the steps of applying a photo-resist according to the present invention.
Figure 2:
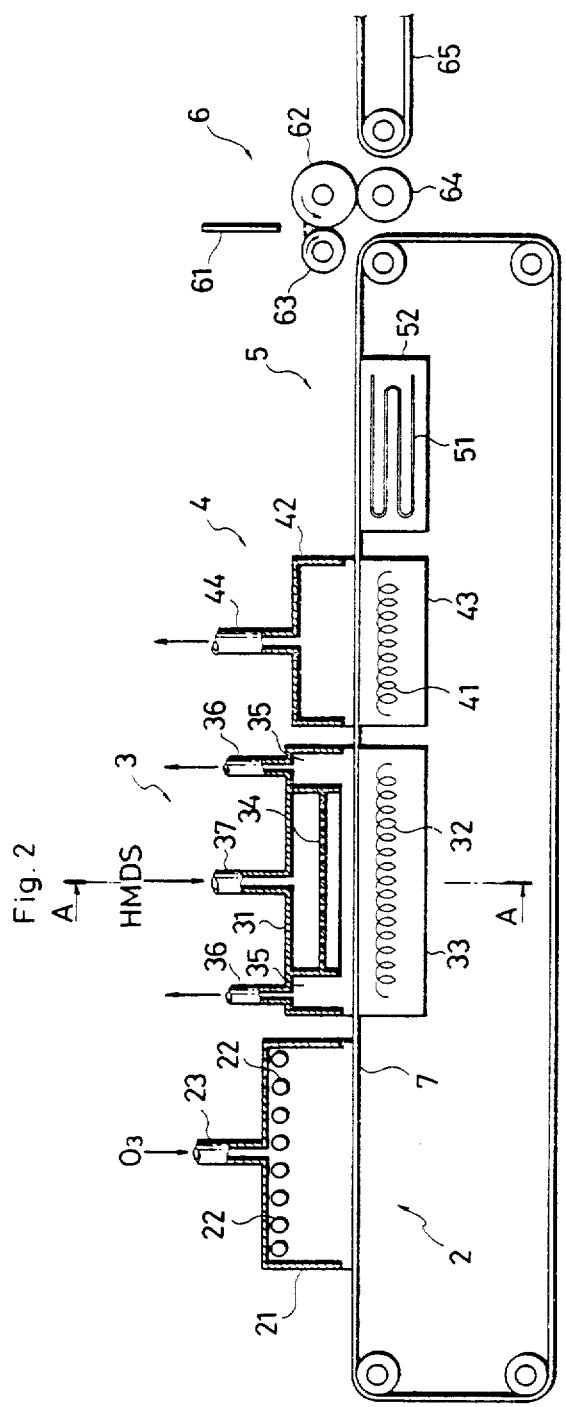
FIG. 2 is a sectional schematic illustration showing an apparatus in which a roll-coating device has been set to the apparatus for applying a photo-resist according to the present invention.

In FIG. 1 and FIG. 2, a substrate 1 is first washed with washing chemicals (for example, conc. sulfuric acid, sodium hydroxide or a neutral detergent, etc.) (S.1); the surface of the substrate 1 is rinsed with pure water to perfectly remove the washing chemicals remaining on the substrate surface (S.2); moisture on the surface of the substrate is perfectly removed by heat-drying the substrate 1 (S.3); organic substances sticked on the substrate surface are decomposed and removed by ultraviolet irradiation or ozone gas feeding, or both of these, in a dry cleaning unit 2 (S.4); HMDS has is fed to the surface of the substrate 2 while heating the substrate 1 in an HMDS feeding unit 3 (S.5); an excessive HMDS on the substrate 1 is removed by vaporization in an additional heating unit 4 (S.6); the substrate 1 is cooled to a room temperature by use of a cooling unit 5 (S.7); the surface of the substrate 1 is coated with a photo-resist in a photo-resist applying unit 6 (S.8); and further the photo-resist on the surface of the substrate is dried (S.9).

The substrate on which a photo-resist layer has been formed according to the above steps is further followed by the steps of printing of desired patterns, developing and etching, to produce the electronic parts mentioned above.

The dry cleaning unit 2 is constituted of a chamber 21 enclosing a side area of a conveyor belt 7, a plurality of ultraviolet lamps 22 provided opposite to the conveyor belt 7 in said chamber 21, and an ozone gas generating unit (not shown) connected to the chamber 21 through a pipe 23. In this dry cleaning unit 2, organic substances on the substrate 1 are decomposed and removed by ultraviolet irradiation and/or ozone feeding clean the substrate surface. In this dry cleaning unit, it is both possible to apply only one of the ultraviolet irradiation and the ozone feeding. The dry cleaning unit 2 itself may be omitted, depending on how the substrate is to be treated.

Figure 6:
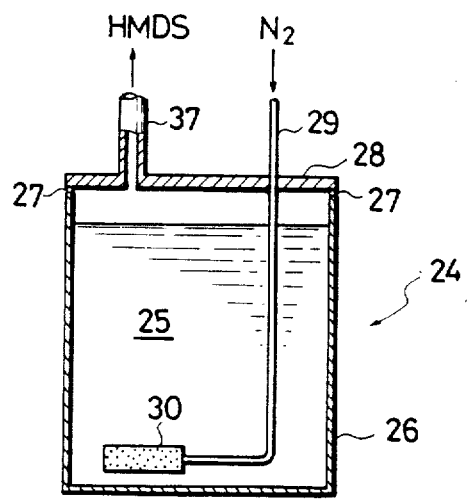
FIG. 6 is a vertically sectional front elevation showing an HMDS gas generating unit.

The HMDS feeding unit 3 is constituted of a treatment chamber 31 enclosing a side area of the conveyor belt 7, a heater 33 having a heating element 32 in it, and a distributor 34 provided opposite to the conveyor belt 7 in the treatment chamber 31. The distributor 34 is provided with a plurality of minute holes. This distributor 34 is provided for the purpose of uniformly feeding HMDS gas introduced into the treatment chamber 31, to the surface of the substrate 1. The treatment chamber 31 is connected to a HMDS gas generating system 24 (FIG. 6) through a pipe 37. An auxiliary chamber 35 for exhaustion is also provided on the periphery of the chamber 31, and this auxiliary chamber 35 is connected to an exhaust system (not shown) through another pipe 36. The HMDS generating system is, as shown in FIG. 6, constituted of a reservoir 26 for reserving liquid HMDS 25, a cover 28 provided on said reservoir 26 sealed through means of a packing 27. A bubbling device 24 is provided within said reservoir 26, and a pipe 29 is connected to said bubbling device 30. HMDS is vaporized by introducing a nitrogen gas from the pipe 29, and the vaporized HMDS is introduced into the treatment chamber 31 through the pipe 37. The HMDS gas introduced into the treatment chamber 31 is uniformly fed to the substrate 1 by virtue of the distributor 34. Further, the HMDS gas is introduced into the auxiliary chamber 35, and exhausted therefrom through the pipe 36.

Figure 3:
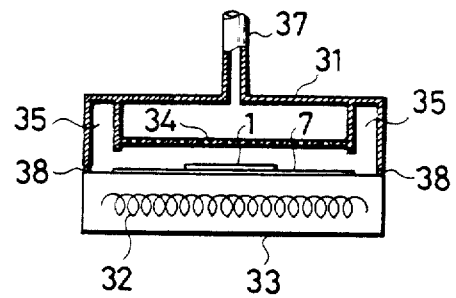
FIG. 3 is a sectional view along the line A—A in FIG. 2.

The treatment chamber 31 is a housing with its bottom face opened, as is seen from FIG. 3, with openings in the direction to which the conveyor belt 7 moves, and with its side portions placed on the heater 33 sealed thereto through means of packings 38. The conveyor belt 7 moves in the treatment chamber 31 in its conveying direction. The conveyor belt 7 comprises a flat conveyor belt, as is seen from FIG. 3, in contact with the top face of the heater 33 for the transfer of heat from the heater to the substrate 1.

Although not shown in the drawing, it is preferable to preheat the substrate to a prescribed temperature prior to the feeding of HMDS to the substrate having been dried. This preheating can facilitate evaporation of water from the substrate surface and prevent moisture from being deposited on the substrate surface, thereby decreasing the generation of substances that may be formed by the combination of adhesion reinforcing agent with water when an adhesion reinforcing agent is fed to the substrate.

The substrate 1 having been treated with HMDS is conveyed to an additional heating unit 4 by means of the conveyor belt 7. This additional heating unit 4 is constituted of a chamber 42 enclosing a side area of the conveyor belt 7 and a heater 43 having a heating element 41 in it. The chamber 42 is connected to an exhaust unit (not shown) through a pipe 44.

The chamber 42 is a housing with its bottom face opened, and with its side portions placed on the heater 43 sealed through means of packings (not shown). The conveyor belt 7 moves in contact with the top face of the heater 43, so that the HMDS excessively remaining on the substrate 1 can be evaporated by the transfer of the heat from the heater to the substrate 1. The HMDS evaporated exhausts through a pipe 44.

In this embodiment, as the heaters 33 and 43, there are illustrated those respectively having heating elements 32 and 41, therein, but they may alternatively may be infrared lamps, or replace by a dry high temperature gas.

The substrate 1 from which the excessive HMDS has been removed is further conveyed to a cooling unit 5 by means of the conveyor belt 7. The cooling unit is constituted of a cooler 52 having therein a cooled water circulating pipe 51. This cooling unit 5 cools the substrate 1 to a room temperature. In this cooling unit 5 also, the conveyor belt 7 moves in in contact with the top face of the cooling unit 52, and the heat of the substrate 1 is dissipated through the conveyor belt 7.

As described above, the conveyor belt 7 is utilized as a means for effecting the heat transfer in the HMDS feeding unit 3, the additional heating unit 4 and the cooling unit 5. Therefore, it is desirable to select, as materials therefor, those having a heat conductivity as high as possible.

Figure 5:
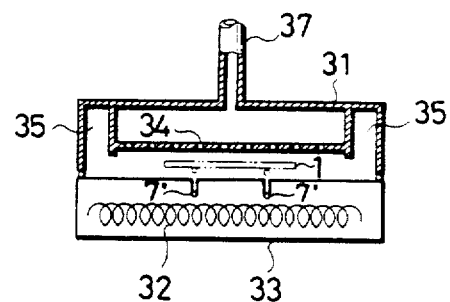
FIG. 5 is a sectional view along the line A—A in FIG. 2, showing another embodiment of the conveyor means.

Also, the conveyor belt may otherwise by a pair of rope type belts 7' as shown in FIG. 5. In this instance, grooves corresponding to the belts 7' are provided on the surface of each of the heaters 33 and 43 and the cooler 52, and said belts 7' are made to be upwardly and downwardly movable. To heat or cool the substrate, the belts 7' are allowed to be held in the grooves to directly connect the substrate 1 and the heater 33 or 34 or the cooler 52, so that the heat transfer to the substrate 1 can be assured. When the substrate is to be shifted, the belts 7' are elevated to lift up the substrate 1 so that it can be conveyed to the next treatment section.

The substrate 1 is further conveyed to a photo-resist applying unit 6 by means of the conveyor belt 7. In the apparatus shown in FIG. 2, there is used the so-called roll-coating device in the photo-resist applying unit 6. This roll-coating device is constituted of a photo-resist feeding nozzle 61, a coating roll 62, a backup roll 64 and a doctor roll 63. The photo-resist fed from the photo-resist feeding nozzle 61 is formed on the substrate 1 as a thin photo-resist layer by means of the coating roll 62 and the doctor roll 63 each rotating in the direction of the arrows along the conveyance of the substrate 1. In the meantime, in FIG. 2, the roll-coating device is schematically shown for the convenience of explanation. Since the detailed construction of such a roll-coating device is obvious to a person having an ordinary skill in the technical filed to which the present invention belongs, detailed explanation on it is omitted, but its construction is disclosed in detail in, for example, U.S. Pat. No. 4,524,715.

The substrate on which the photo-resist layer has been formed as described above is further conveyed to the subsequent treatment units by means of the conveyor belt 65.

The method of, and the apparatus for, applying a photo-resist according to the present invention is constituted as described above in brief.

Now, the main reason why the adhesion of a photo-resist to the surface of a substrate is improved by feeding an adhesion reinforcing agent such as HMDS to the substrate, is understood as follows:

An oxide layer comprising $SiO_2$ or the like, formed on the surface of a substrate, is hydrophilic. When an adhesion reinforcing agent is fed to this oxide layer, the surface of the substrate turns to be hydrophobic according to a chemical reaction set out below for example, whereby the adhesion of the photo-resist is improved.

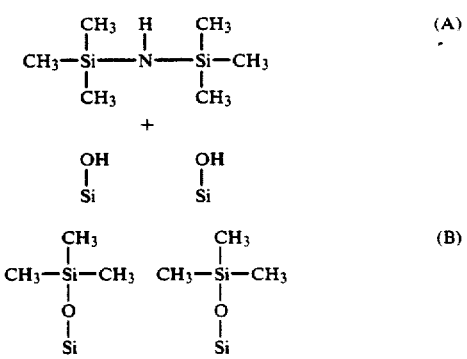

In the above (A), HMDS reacts with $SiO_2$ in the $SiO_2$ layer formed on the surface of the substrate. By this reaction, the $SiO_2$ layer turns to the state as shown in (B) to become hydrophobic. Thus, it is understood that the adhesion of the photo-resist is improved.

However, although the photo-resist can be well adhered to the $SiO_2$ layer having been made hydrophobic, the HMDS itself has not the adhesion property. Accordingly, if excessive HMDS remains unremoved on the surface of the substrate after completion of the above reaction, the adhesion between the photo-resist and the substrate face can be reduced and caused the problem that side etching occurs, as mentioned above.

Accordingly, in the apparatus shown in FIG. 2, the additional heating unit is provided for the purpose of improving the adhesion of a photo-resist to a substrate by evaporating the excessively fed HMDS from the surface of the substrate 1.

Meanwhile, the reason why the irregularities mentioned here in the beginning may occur due to the narrow grooves provided on the periphery of the roll of a roll-coating device, is understood as follows. That is, although the photo-resist can be applied in close adhesion to the surface of the substrate at the part corresponding to the narrow grooves on a coating roll, the diffusion of the photo-resist is supposed at the other part at which the photo-resist has been insufficiently fed, because of the HMDS remaining on the substrate surface or the substances formed by combination of HMDS with moisture contained in air, thereby causing the irregularities in the photo-resist coating. Thus, as shown in FIG. 2, the substrate is heated in the additional heating unit 4 after the adhesion reinforcing agent has been fed in the HMDS feeding unit 3, thereby evaporating and removing the adhesion reinforcing agent remaining on the substrate or the substances formed by combination of the adhesion reinforcing agent with moisture in air. Owing to such additional heating, the photo-resist applied on the substrate can be smoothly spread through the entire 453 surface of the substrate to obtain a uniform resist coating.

In the embodiment shown in FIG. 2, there is shown an embodiment in which a roll-coating device is used in the photo-resist applying unit 6. However, the present invention is also applicable to the coatings by a spin-coating device.

Figure 7:
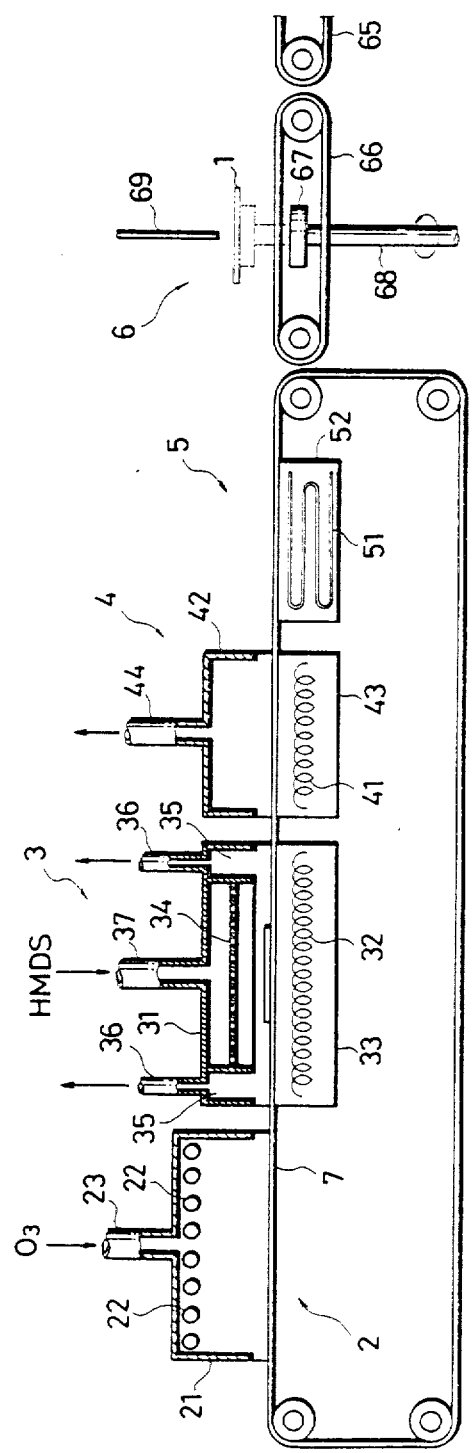
FIG. 7 is a sectional schematic illustration showing an apparatus in which a spin-coating device has been set to the apparatus for applying a photo-resist according to the present invention.
Figure 8:
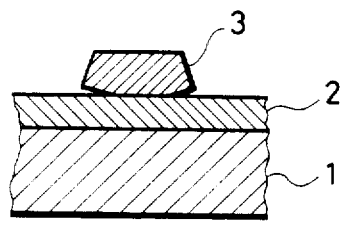
FIGS. 8 and 9 are schematic sectional views for showing problems in a prior art.
Figure 9:
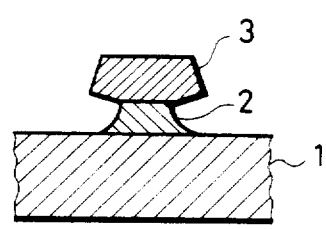

FIG. 7 shows an embodiment in which a spin-coating device has been set to the photo-resist applying unit. In FIG. 7, a dry cleaning unit 2, an HMDS feeding unit 3, an additional heating unit 4 and a cooling unit 5 are all the same as those in the embodiment shown in FIG. 2, and therefore explanations on these are omitted here. A spin-coating device 6 is constituted of a conveyor means 66, a substrate holder 67 on which the substrate 1 is placed, an upwardly and downwardly movable rotating shaft 68 fixed to the holder 67, and a photo-resist feeding nozzle 69 provided opposite to said holder 67, wherein the substrate is shifted from conveyor belt 7 to the conveyor means 66. The substrate 1 held on the conveyor means 66 is shifted onto the holder 67, and, while rotating the holder 67 at a predetermined speed and at the position shown by chain lines in FIG. 7, a photo-resist is dropwise fed from the nozzle 69 to form a uniform resist coating on the substrate. After formation of the resist coating on the substrate 1, the rotation of the holder 67 is stopped, and then the holder 67 is lowered to shift the substrate again onto the conveyor means 66. Thereafter, the substrate is further shifted from the conveyor means 66 to a subsequent conveyor means 65. In FIG. 7, the spin-coating device is schematically illustrated for the convenience of explanation. Since the detailed construction of such a roll-coating device is obvious to a person having an ordinary skill in the techincal field to which the present invention belongs, detailed explanation on it is omitted, but its construction is disclosed in detail in, for example, U.S. Pat. No. 4,315,705.

Figure 4:
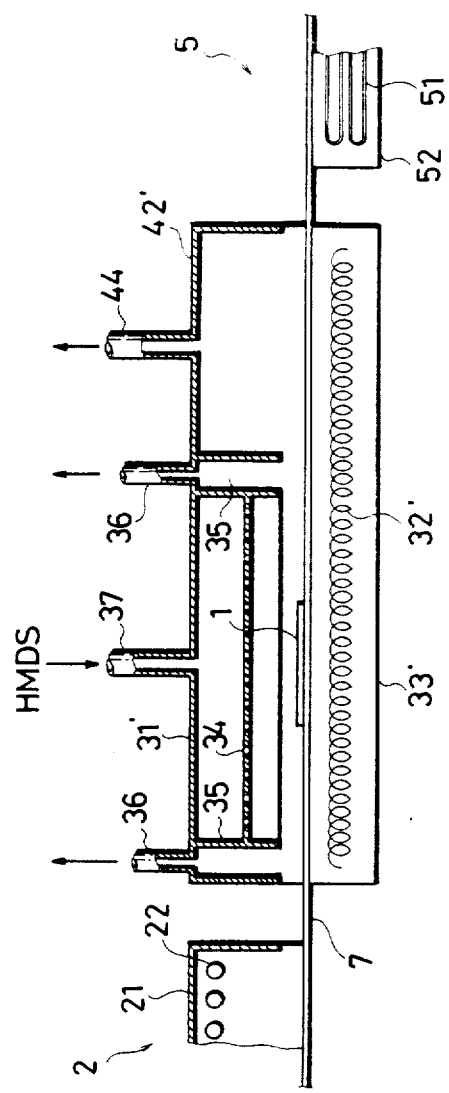
FIG. 4 is a partial sectional view showing an embodiment in which an HMDS feeding unit 3 and an additional heating unit 4 have been integrally combined.

In the two embodiment shown in FIG. 2 and FIG. 7, the heater 33 in the HMDS feeding unit 3 and the heater 43 in the additional heating unit 4 are provided separately from each other, but these heaters 33 and 43 in the respective units may be integrally combined. In FIG. 4, there is shown an embodiment in which the above heaters 33 and 43 have been integrally combined. In FIG. 4, the same numerals as those in the embodiments shown in FIG. 2 and FIG. 7 denote the same portions, and explanations on such portions are omitted.

In FIG. 4, a heater 33' has internally a heating element 32', and a chamber 31' and a chamber 42' are constructed by integrally combining the chamber 31 with the chamber 42 shown in FIG. 2, each of which is constituted in the same manner as in the chamber 31 and the chamber 42. How the embodiment shown in FIG. 4 can operate is obvious from the foregoing descriptions to a person having an ordinary skill in the technical field to which the present invention belongs, and therefore more detailed explanation is omitted.

In the respective embodiments described above, HMDS is used as the adhesion reinforcing agent. Besides this, however, any other known adhesion reinforcing agents such as chlorosilane can of course be used.

EXPERIMENT

An experimental example for applying a photo-resist to the substrate 1, carried out by using the apparatus shown in FIG. 2, is shown below.

After a wafer 1 was subjected to the treatments corresponding to S.1 to S.4 shown in FIG. 1, the wafer was preheated to 120° C. in advance, and then conveyed to an HMDS feeding chamber 31. While heating the wafer 1 also in this HMDS feeding chamber 31, HMDS was fed to the substrate. The conditions therefor were as follows:

Feed of HMDS gas: 10 Nl/min.
HMDS gas feeding time: 30 to 60 sec.
Surface temperature of the heater 33: 120° C.

Subsequently, the wafer was shifted onto the heater 43, where the wafer 1 was further additionally heated. The conditions therefor were as follows: Surface temperature of the heater 43: 120° C.

Heating time: 60 sec.

After having been treated as above, a photo-resist was applied by use of the roll-coating device shown in FIG. 2, whereupon a very uniform coating was obtained. Further, desired patterns were printed, followed by developing, whereupon there was seen no rise of the photo-resist at the peripheral portions of the patterns to obtain very good results.

According to various experiments carried out by the present inventor, good results were obtained in both the cases when a roll-coating device was used in the photo-resist applying unit and when a spin-coating device was used. It was also confirmed from the various experiments carried out by the present inventor, that the heating temperature in the additional heating unit 4 is preferable in the range of 100° to 200° C., particularly from 100° to 120° C., to obtain desired results.

What is claimed is:

1. An apparatus for applying a photo-resist to the surface of a substrate to be treated comprising:
   (i) conveyor means for conveying said substrate,
   (ii) adhesion reinforcing agent feeding means, for feeding an adhesion reinforcing agent to said substrate, comprising a treatment chamber enclosing a portion of said conveyor feeding pipe for feeding said adhesion reinforcing agent to said treatment chamber, distributor means having a plurality of minute holes provided therein opposite to the substrate in said treatment chamber and being connected with said feeding pipe, an auxiliary chamber provided on the periphery of said treatment chamber and being connected to exhaust means for exhausting gases, and heating means for heating said substrate, (iii) additional heating means, provided at a stage posterior to said adhesion reinforcing agent feeding means, for further heating said substrate, and (iv) photo-resist feeding means, provided at a stage posterior to said additional heating means, for feeding the photo-resist to the surface of said substrate.

2. The apparatus for applying a photo-resist according to claim 1, wherein said adhesion reinforcing agent feeding means and said additional heating means are provided integrally.

3. The apparatus for applying a photo-resist according to claim 1, further comprising cooling means, provided at a stage posterior to said additional heating means, for cooling said substrate to room temperature.

4. The apparatus for applying a photo-resist according to claim 3, wherein at least one of ultraviolet irradiation means and ozone feeding means is provided at a stage anterior to the adhesion reinforcing agent feeding means to clean the surface of said substrate.

5. The apparatus for applying a photo-resist according to claim 1, wherein said additional heating means comprises a chamber enclosing a peripheral area of the substrate and exhaust means connected to said chamber for exhausting gases.

6. The apparatus for applying a photo-resist according to claim 5, wherein at least one of ultraviolet irradiation means and ozone feeding means is provided at a stage anterior to the adhesion reinforcing agent feeding means to clean the surface of said substrate.

* * * * *